(12) United States Patent
Baumgartner et al.

(10) Patent No.: US 7,156,938 B2
(45) Date of Patent: *Jan. 2, 2007

(54) METHOD FOR MAKING MULTI-LAYER CERAMIC ACOUSTIC TRANSDUCER

(75) Inventors: Charles E. Baumgartner, Niskayuna, NY (US); Robert S. Lewandowski, Amsterdam, NY (US)

(73) Assignee: General Electric Company, Niskayuna, NY (US)

( * ) Notice: Subject to any disclaimer, the term of this patent is extended or adjusted under 35 U.S.C. 154(b) by 12 days.

This patent is subject to a terminal disclaimer.

(21) Appl. No.: 10/706,840

(22) Filed: Nov. 11, 2003

(65) Prior Publication Data

US 2005/0099097 A1    May 12, 2005

(51) Int. Cl.
    *B32B 37/00*    (2006.01)
(52) U.S. Cl. .................. 156/150; 156/89.12; 156/151; 156/153; 156/256; 29/25.35; 310/311; 310/313 B; 310/334; 310/365
(58) Field of Classification Search .................. 156/60, 156/89.12, 150, 151, 153, 260, 264, 266; 29/25.35; 310/311, 313 B, 334, 365
    See application file for complete search history.

(56) References Cited

U.S. PATENT DOCUMENTS

| | | | | |
|---|---|---|---|---|
| 4,217,684 A | | 8/1980 | Brisken et al. | 29/25.35 |
| 4,460,841 A | | 7/1984 | Smith et al. | 310/334 |
| 4,939,826 A | * | 7/1990 | Shoup | 29/25.35 |
| 5,329,496 A | | 7/1994 | Smith | 367/140 |
| 5,359,760 A | * | 11/1994 | Busse et al. | 29/25.35 |
| 5,381,385 A | | 1/1995 | Greenstein | 367/140 |
| 6,088,894 A | * | 7/2000 | Oakley et al. | 29/25.35 |
| 6,225,728 B1 | * | 5/2001 | Gururaja | 310/334 |
| 6,467,140 B1 | * | 10/2002 | Gururaja | 29/25.35 |
| 6,868,594 B1 | * | 3/2005 | Gururaja | 29/25.35 |
| 7,017,245 B1 | * | 3/2006 | Baumgartner et al. | 29/25.35 |

OTHER PUBLICATIONS

Goldberg et al., "Multi-Layer PZT Transducer Arrays for Improved Sensitivity", 1992 IEEE Ultrasonics Symposium, pp. 551-554.
Saitoh et al., "A Low-Impedance Ultrasonic Probe Using a Multilayer Piezoelectric Ceramic," Jap. Jour. Appl. Phys., vol. 28, Supp. 28-1, pp. 54-56 (1989).
Desilets et al., "Effect of Wraparound Electrodes on Ultrasonic Array Performance," 1998 IEEE Ultrasonics Symposium (preprint).
Martin et al., "Back-Face Only Electrical Connections of Thickness Mode Piezoelectric Transducers," IEEE Trans. UFFC, vol. 33, No. 6, 778-781 (1986).

* cited by examiner

*Primary Examiner*—Jeff H. Aftergut
(74) *Attorney, Agent, or Firm*—Fletcher Yoder

(57) ABSTRACT

Methods for preparing a multi-layer acoustic transducer with reduced total electrical impedance. The methods are based on the stacking of individual piezoelectric layers with metallized surfaces to form a plate in which the metal layers are electrically connected to form interdigitated electrodes. The total electrical impedance of a multi-layer stack comprised of piezoelectric layers connected in this manner is inversely related to the square of the number of layers in the stack. This provides for better matching of the acoustic stack impedance to that of the electrical cable and improved acoustic element sensitivity.

23 Claims, 5 Drawing Sheets

METHOD FOR MAKING MULTI-LAYER CERAMIC ACOUSTIC TRANSDUCER

BACKGROUND OF THE INVENTION

This invention generally relates to multi-layer piezoelectric ceramic transducers. In particular, the invention relates to the design of ultrasound transducers to improve the sensitivity of an ultrasound imaging system.

Acoustic transducers used in ultrasound imaging are constructed of a piezoelectric material whose surfaces are metal coated and connected to a potential (signal) and ground source respectively. This piezoelectric material is typically comprised of a composition of lead zirconate titanate (PZT) ceramic. During operation, a high-frequency electrical waveform is applied to the PZT electrodes, causing a change in ceramic dimension and generating an acoustic pressure wave or pulse. Conversely when an acoustic reflection contacts the surface of the piezoelectric material, it generates a voltage difference across the electrodes that is detected as a receive signal.

Coaxial cables connecting the acoustic transducer to the system used to generate and detect the electrical waveforms, typically possess an electrical impedance of between 50 to 100 ohms. It is desirable that the elements of an acoustic transducer also possess an electrical impedance similar to that of the cable. However the electrical impedance of the transducer element is a function of the piezoelectric material dielectric constant, the geometric area, and thickness. Since the acoustic response and frequency of a piezoelectric element are optimized for specific relationships relating to geometric area and thickness, these parameters cannot be optimized to match the electrical impedance of the cable.

The impedance matching is particularly important for small transducer elements such as those found in a two-dimensional transducer array. Typical linear phased-array transducer elements are rectangular in shape, that is, they are longer in the elevation direction than in azimuthal direction. However, elements for a two-dimensional array may approach a square geometry in which the elevation direction is shortened to match that in azimuth. Therefore, the smaller two-dimensional array elements possess a significantly higher electrical impedance, perhaps greater than 1000 ohms. Meanwhile ultrasound system cables typically possess an impedance of between 50 to 100 ohms. This impedance mismatch greatly reduces electrical efficiency and, hence, element sensitivity. Through the use of a multi-layer transducer stack, the element impedance of a two-dimensional array can be made much closer to that of the cable.

Ultrasound transducers used for medical imaging and non-destructive testing are characterized by two main properties, sensitivity and bandwidth, which are directly correlated to the penetration and resolution of the imaging system. It is well known in the art that multi-layer piezoelectric structures provide a sensitivity enhancement compared to conventional single-layer devices. This occurs because the multi-layer structure reduces the impedance of the piezoelectric ceramic element, e.g., lead zirconate titanate (PZT). Each element is prepared as a multiple of individual ceramic layers connected electrically in parallel but acoustically in series. In this manner, the element still functions acoustically as if it were a solid ceramic while possessing an electrical impedance that is reduced by the square of the number of ceramic layers.

In a multi-layer PZT transducer array, the N (N>1) layers are coupled acoustically in series, so that the ë/2 resonant thickness is t, the stack thickness. When the polarity of an applied voltage matches the poling direction, the piezoelectric material expands in the thickness direction. Since the electrical polarity is the same as the poling direction for each layer, the layers will expand or compress together. For a given applied voltage, the electric field across each layer (thickness t/N) is greater than that for a single-layer transducer (thickness t), resulting in a larger acoustic output. Conversely, the acoustic output of a single-layer transducer can be equaled at a reduced applied voltage. Electrically, the layers are connected in parallel. Compared to a single-layer device, an N-layer device is essentially the sum of N thinner capacitors in parallel. Since the overall thickness of the structure remains constant for a given frequency of operation, the capacitance of the device increases as a function of $N^2$. Correspondingly, the impedance drops as a function of the inverse of $N^2$.

U.S. Pat. No. 6,260,248 discloses a method of forming a multi-layer monolithic piezoelectric actuator by placing electrodes onto green piezoelectric substrates and then co-firing to form a solid multi-layer structure. However, for structures formed by this method, it is difficult to maintain the tolerances necessary for ultrasound transducers since co-firing of the piezoelectric and electrode materials can lead to waviness or non-planarity in the layers. Also, the formation of piezoelectric ceramics with high electromechanical coupling needed for medical ultrasound applications are best done under high-pressure sintering conditions that are not conducive to layered structures of this type. Therefore it is best to form the multi-layer structure from flat, high-quality piezoelectric sheets rather than from co-fired green ceramic substrates.

A second approach disclosed in U.S. Pat. No. 5,381,385 is to form a layered structure of thin piezoelectric layers, each of which possesses a metal electrode on its surface. The array is fabricated by forming holes (or vias) in a stack of piezoelectric material. The vias may be formed by laser or mechanical drilling. However, drilling of ceramics is a difficult feat, particularly so for small holes through thicker ceramic substrates. Low-frequency acoustic transducers possess a ceramic that may be too thick to easily form vias and small element size for higher-frequency transducers requires a high density of vias, which weakens the ceramic structure. In addition, after the vias have been formed, electrical contact needs to be made to the embedded electrode in the buried ceramic layer. This can be difficult to accomplish due to the aspect ratio of the hole unless the via is large in area.

There is a need for simpler methods of manufacturing multi-layer piezoelectric ceramic structures.

BRIEF DESCRIPTION OF THE INVENTION

The present invention is directed to simple methods for preparing a multi-layer acoustic transducer with reduced total electrical impedance. The methods are based on the stacking of individual piezoelectric layers with metallized surfaces to form a plate in which the metal layers are electrically connected to form interdigitated electrodes. The total electrical impedance of a multi-layer stack comprised of piezoelectric layers connected in this manner is inversely related to the square of the number of layers in the stack. This provides for better matching of the acoustic stack impedance to that of the electrical cable and improved acoustic element sensitivity.

One aspect of the invention is a method of manufacturing a workpiece, comprising the following steps: (a) placing respective layers of metal on the surfaces of both sides of a plate of ceramic material, the surfaces being generally mutually parallel; (b) cutting the metallized ceramic plate along parallel planes perpendicular to the metal layers to form a multiplicity of bars with respective sections of the cut metal layers disposed on opposite sides of each bar; (c) stacking the bars with metal layer facing metal layer, each pair of contacting metal layers forming a respective electrode; (d) bonding the stacked bars to form a stack with metal edges of the electrodes exposed on the periphery of the stack; (e) placing a first layer of dielectric material on a first face of the stack; and (f) placing a second layer of dielectric material on a second face of the stack. Each of the first and second dielectric layers comprises a respective substrate that supports a respective pattern of metal applied to the dielectric either before or following placement of the dielectric layers on the respective faces of the stack. Metal-filled or metal-coated vias are formed in the first dielectric layer for electrically connecting the metal patterns on the first dielectric layer to respective odd-numbered electrodes and in the second dielectric layer for electrically connecting the metal patterns on the second dielectric layer to respective even-numbered electrodes.

Another aspect of the invention is a method of manufacturing a workpiece, comprising the following steps: (a) placing respective layers of metal on the surfaces of both sides of a plate of ceramic material, the surfaces being generally mutually parallel; (b) cutting the metallized ceramic plate along parallel planes perpendicular to the metal layers to form a multiplicity of bars with respective sections of the cut metal layers disposed on opposite sides of each bar; (c) stacking the bars with metal layer facing metal layer, each pair of contacting metal layers forming a respective electrode; (d) bonding the stacked bars with a thin adhesive bond to form a bonded stack with metal edges of the electrodes exposed on the periphery of the bonded stack; (e) placing a first layer of dielectric material on one face of the bonded stack; (f) placing a second layer of dielectric material on another face of the bonded stack; (g) forming openings in the first dielectric layer to expose portions of prespective edges of the odd-numbered electrodes; (h) forming openings in the second dielectric layer to expose portions of respective edges of the even-numbered electrodes; (i) filling or coating the openings with metal; and (j) placing respective layers of metal on the surfaces of the first and second dielectric layers in respective patterns, the respective patterned metal layers of the first and second dielectric layers being electrically connected to respective sets of odd-and even-numbered electrodes via the metal-filled or metal-coated openings.

A further aspect of the invention is a method of manufacturing comprising the following steps: (a) placing respective layers of metal on the surfaces of both sides of each of a multiplicity of substantially identical plates of ceramic material, the metallized surfaces of each plate being generally mutually parallel; (b) laminating the metallized plates together with confronting metallized surfaces to form a block; and (c) cutting the block along parallel planes perpendicular to the metal layers to form a multiplicity of stacks, each stack comprising alternating ceramic layers and electrodes with metal edges of the electrodes exposed on the periphery of each stack.

Another aspect of the invention is an ultrasound transducer array precursor comprising: a stack comprising a multiplicity of layers of ceramic material and a multiplicity of electrodes stacked in alternating sequence, the multiplicity of electrodes comprising odd-numbered electrodes and even-numbered electrodes arranged in alternating sequence, with one metal edge of each odd-numbered electrode being exposed on a first face of the stack and one metal edge of each even-numbered electrode being exposed on a second face of the stack; a first layer of dielectric material joined to the first face of the stack; a second layer of dielectric material joined to the second face of the stack; a first metal pattern formed on or in the first dielectric layer; a second metal pattern formed on or in the second dielectric layer; a first set of metal-filled or metal coated vias or channels formed in the first dielectric layer for electrically connecting the first metal pattern to the odd-numbered electrodes; and a second set of metal-filled or metal-coated vias or channels formed in the second dielectric layer for electrically connecting the second metal pattern to the even-numbered electrodes.

Yet another aspect of the invention is an ultrasound transducer array comprising a first row of laminated transducer elements that are acoustically isolated from each other, each of the laminated transducer elements comprising: a stack comprising first, second and third layers of ceramic material of substantially equal thickness; a first electrode disposed on the top of the first ceramic layer; a second electrode disposed between the first and second ceramic layers; a third electrode disposed between the second and third ceramic layers; a fourth electrode disposed on the bottom of the third ceramic layer; a first electrical connector disposed on one side of the stack and electrically connecting the first and third electrodes; a second electrical connector disposed on the other side of the stack and electrically connecting the second and fourth electrodes; a first layer of dielectric material disposed on the one side of the stack between the first electrical connector and an edge of the third electrode; and a second layer of dielectric material disposed on the other side of the stack between the second electrical connector and an edge of the second electrode.

The present invention is not limited to the manufacture of multi-layer stacks having only three layers.

Other aspects of the invention are disclosed and claimed below.

BRIEF DESCRIPTION OF THE DRAWINGS

FIGS. 3–6 show alternating recessed electrodes, recessing of the electrodes is optional.

Reference will now be made to the drawings in which similar elements in different drawings bear the same reference numerals.

DETAILED DESCRIPTION OF THE INVENTION

The method disclosed herein involves preparing a multi-layer acoustic stack based on laminating individual piezoelectric layers that possess metal electrodes on both faces, followed by connecting these electrodes in a manner that yields an interdigitated electrode connection. These methods are useful for preparing elements in both a linear acoustic array and also small elements for a two-dimensional acoustic array. Such acoustic arrays are useful for medical imaging applications.

The method disclosed herein for forming multi-layer piezoelectric acoustic transducers does not entail weakening the structural integrity of the piezoelectric element by removal of a portion of the ceramic element. Furthermore, the method is capable of preparing multi-layer stacks possessing several layers without added complexity. The method is based on laminating together discrete bars of metallized piezoelectric ceramic in such a manner as to form a laminated ceramic plate possessing internal metal lines comprised of the surfaces of the individual layers.

It should be noted that instead of laminating discrete bars, one could laminate plates of metallized piezoelectric ceramic. This would form a block of ceramic possessing internal metal electrodes. Plates would then be cut from this block perpendicular to the internal electrodes to form a laminated ceramic plate possessing internal metal lines. These plates subsequently would have electrical contact made to alternating metal lines so as to yield an interdigitated electrode configuration.

Each electroded plate can be diced and reconfigured to yield multi-layer elements for a linear acoustic transducer array or diced again in the direction perpendicular to the electrodes for a two-dimensional transducer array configuration.

There are two major advantages of an acoustic transducer prepared using a multi-layer piezoelectric stack as compared to a solid piezoelectric ceramic: reduced electrical impedance of the transducer elements and a reduction in the voltage required to generate sufficient ultrasound energy for medical diagnostic imaging. The method disclosed here overcomes difficulties found with earlier attempts to manufacture multi-layer piezoelectric stacks.

Figure 1:
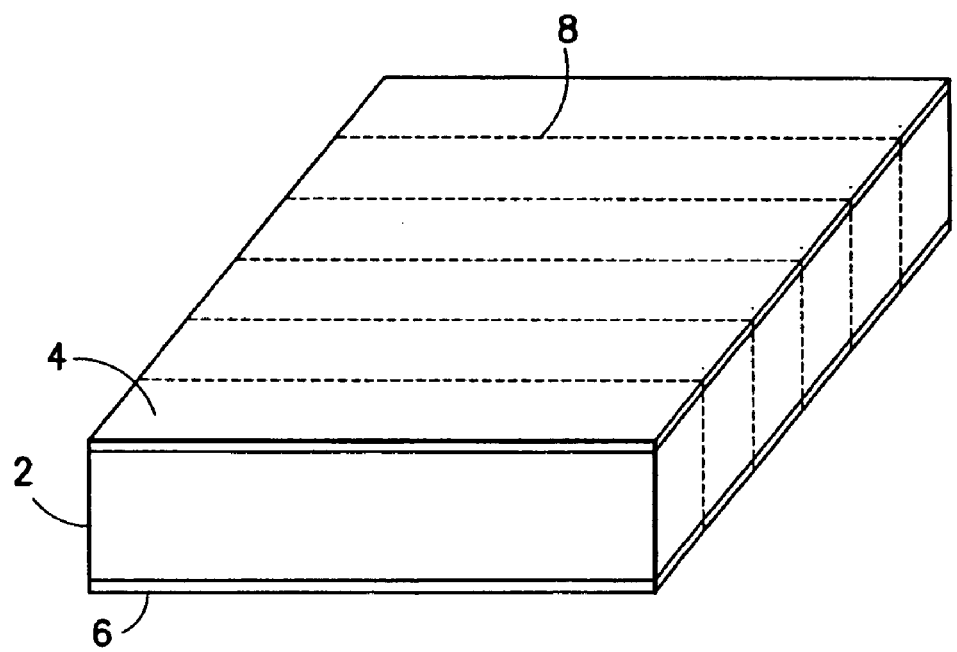
FIGS. 1–6 depict various stages in a method of manufacture in accordance with one embodiment of the invention. Although

Referring to FIG. 1, the first step in the method of manufacture is to form or cut a plate-shaped parallelepiped of piezoelectric ceramic material 2. Respective layers of metal 4 and 6 are then deposited on the mutually parallel, large-area faces of the piezoelectric ceramic layer 2. The metal thickness is commonly less than 5 microns, and most commonly less than 2 microns. This metallized plate is then diced along a multiplicity of mutually parallel cut planes 8 (indicated by dashed lines in FIG. 1) that are perpendicular to the metallized faces of the ceramic layer. This dicing operation produces a multiplicity of substantially identical bars, metallized on two faces on opposite sides.

Figure 2:
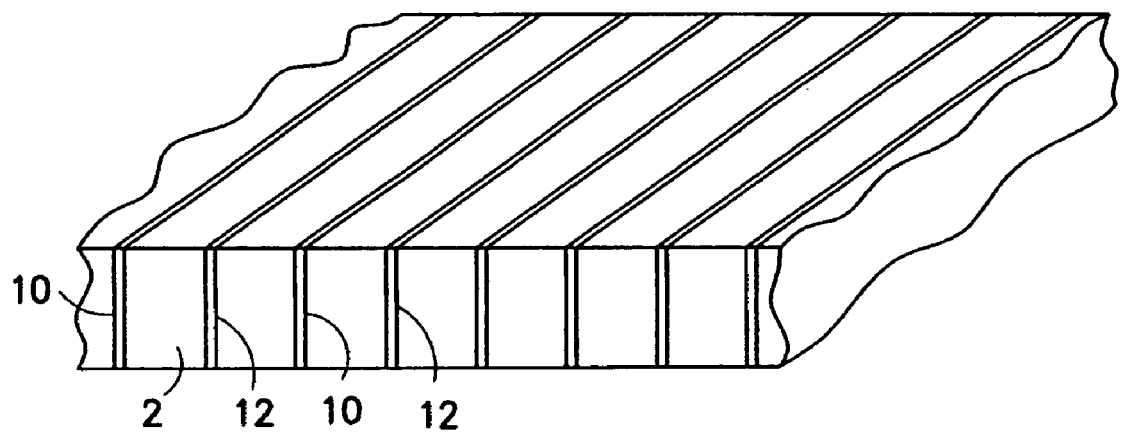

In the next stage of manufacture, the bars are rotated 90 degrees and arranged in a stack (the stack is on its side in FIG. 2), with the metal layers of adjacent bars mutually confronting, and then the bars are laminated to form a solid plate of material, as seen in FIG. 2. The metal layers deposited on the original plate become the internal electrodes 10 and 12 in the multi-layer stack shown in FIG. 2. The thickness of the original plate (see FIG. 1) will equal the thickness of each layer in the final multi-layer stack. Adjacent bars are bonded together by a thin layer of epoxy placed between the confronting metallized surfaces. The thickness of the epoxy bond should be sufficiently thin as to be acoustically transparent and, preferably, sufficiently thin to allow for electrical connection between contiguous metal surfaces. For the sake of simplicity, the contiguous metal layers are depicted in FIG. 2 as individual electrodes. If the electrodes are numbered starting from the left-hand side of FIG. 2 and continuing to the right, the electrodes 10 represent the odd-numbered electrodes (first, third, fifth, etc.), while the electrodes 12 represent the even-numbered electrodes (second, fourth, sixth, etc.). After being formed, the bonded stack is ground flat on both large-area faces so that the internally contained metal electrodes 10, 12 are perpendicular to the ground faces.

Optionally, the edges of the odd-numbered electrodes 10 are recessed from one face of the bonded stack, for example, by cutting a channel and then filling the channel with an electrically isolating material, such as epoxy. One such filled channel 14 is shown in dashed lines in FIG. 3. This would be done for each odd-numbered electrode 10. (Other filled channels have not been demarcated to avoid clutter in the drawing.) Conversely, the edges of the even-numbered electrodes 12 are recessed from the other face of the bonded stack.

Figure 3:
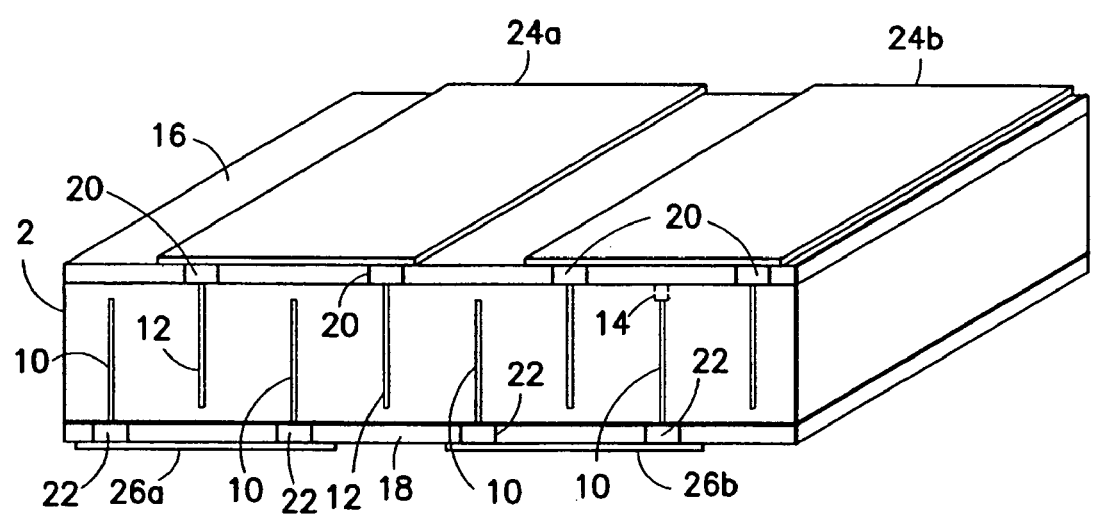

The next stage in the manufacturing process is to connect every other internal electrode by forming a metal bridge between, for example, the first and third electrodes without making contact to the second electrode on one side of the laminated plate and then between the second and fourth electrodes without making contact to the third electrode on the reverse side of the plate. Electrode connections preferentially should be separated from the piezoelectric ceramic edges by a dielectric material to avoid distortion of the applied electrical field and the generation of shear waves within the piezoelectric ceramic. This is accomplished by coating or covering each of the ground faces with a dielectric material. Initially a continuous layer of dielectric material 16 is applied on the top ground face of the bonded stack, and another continuous layer of dielectric material 18 is applied on the bottom ground face, layers 16 and 18 being shown at a subsequent manufacturing stage in FIG. 3. As seen in FIG. 3, discontinuities are subsequently formed in the continuous layers of dielectric material 16 and 18, as explained in detail below.

Suitable dielectric materials can be selected from common electrical insulators, including, but not limited to, parylene, polyimide, polyamideimide, polyurethane, and other materials such as epoxy or silicone, and can be applied by coating, dipping, lamination, or vapor deposition. [Parylene is the commercial name for polymers that belong to the chemical family poly-para-xylylene.] Exemplary suitable dielectric materials are Kapton™ HN film having a thickness of 8 microns and an average dielectric breakdown strength of >200 volts/micron laminated to the ceramic; a 7-micron-thick layer of Parylene-N having an average dielectric breakdown strength of >300 volts/micron vapor-deposited on the ceramic; or a 7-micron-thick layer of Parylene-C having an average dielectric breakdown strength of >300 volts/micron vapor-deposited on the ceramic.

Several methods for making the electrical connection through this dielectric material are envisioned. For example, in one embodiment a dicing saw is used to cut parallel channels in one layer of dielectric material, the channels being placed to expose alternating metal electrodes (e.g., electrodes 12) on one side of the plate. The channels are then filled with metal to form electrical connectors 20, as seen in FIG. 3. This process is then repeated on the reverse side, exposing the electrodes (e.g., electrodes 10) not exposed on the first side and filling the resulting channels with metal to form electrical connectors 22 portions of the exposed surfaces of the layers of dielectric material are then metallized, using, for example, sputtering or electroless plating, to short electrodes 10 on one side of the plate and to short electrodes 12 on the other side of the plate. In the example depicted in FIG. 3, metal layer 24a shorts two electrodes 12 via connectors 20, while metal layer 24b shorts another two electrodes 12 via more connectors 20. On the other side, metal layer 26a shorts two electrodes 10 via connectors 22, while metal layer 26b shorts another two electrodes 10 via more connectors 22. These steps can be repeated along the entire length of the bonded stack or plate.

In accordance with a second embodiment, holes or vias may be formed in the dielectric material using a laser, the vias being located over alternating embedded metal electrodes on each side of the plate. In other words, the channels of the first embodiment are now replaced by vias. A metal layer is then applied to electrically short each of the exposed electrodes, as previously described for the first embodiment.

In accordance with a third embodiment, electrical connection may be made by laminating a flex circuit possessing filled vias that serve the function of electrical connections 20 and 22 seen in FIG. 3. Each flex circuit comprises a dielectric film (corresponding to layers 16 and 18 in FIG. 3) having areas of metallization (corresponding to metal layers 24a, 24b and 26a, 26b in FIG. 3) printed on the surfaces or embedded below the surface.

Other methods of connecting the internal metal electrodes so as to provide an interdigitated electrical connection are envisioned, such as the use of a photosensitive dielectric layer and photo patterning or laser writing techniques.

In the next stage of manufacture, a layer of electrically insulating spacer material 28 is laminated over the deposited electrodes 24a and 24b. The spacer material is optionally ground to a thickness that will produce a desired pitch of the transducer array. The spacer material, if not to be removed from the final array, should be a material that will not cause acoustic cross-talk between adjacent transducer elements. One such material is epoxy filled with glass beads. However, if the spacer material does cause unacceptable acoustic cross-talk, then that spacer material should be removed, e.g., by dicing or other means. Alternatively, the spacer material may be glycol phthalate, which is often used as a wafer bonding material. Glycol phthalate can be heated to a point of liquefaction or dissolved in an appropriate solvent, thereby facilitating removal of the spacer material in a later stage.

Optionally, respective layers of spacer material may be laminated to both faces of the electroded plate shown in FIG. 3, the sum of the thicknesses of the two layers being determinative of the pitch of the finished transducer array.

Figure 4:
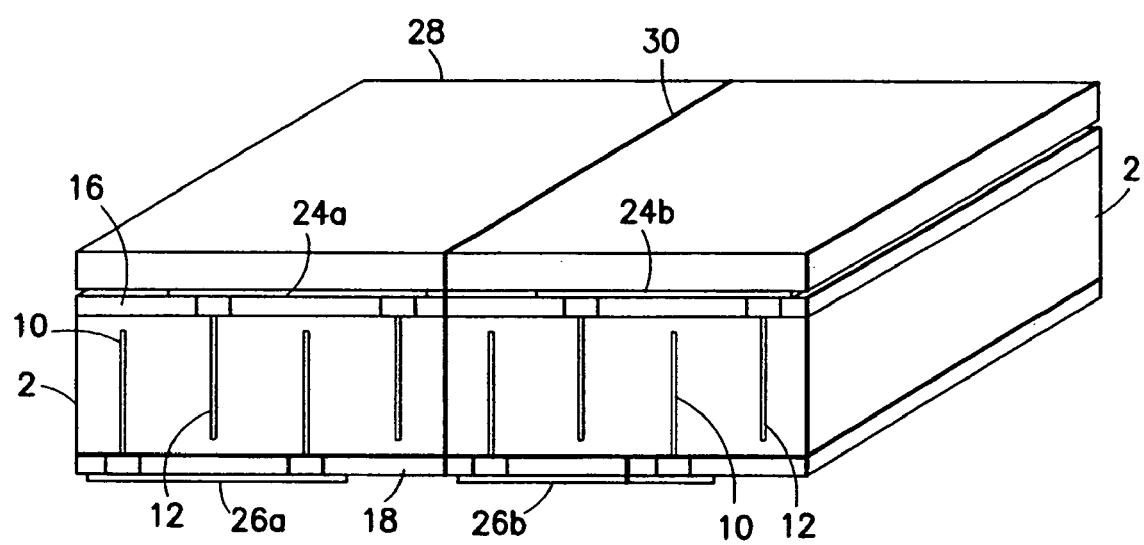

After the spacer material has been applied, the electroded plate is then cut into bars by dicing parallel to the embedded metal layers (i.e., electrodes 10 and 12) such that the final number of layers for the multi-layer stack are retained. In the example shown in FIG. 4, the stack is cut along line 30 to form two precursor bars. However, it should be appreciated that the stack may have a greater length so that a number of equal-length precursor bars greater than two will be formed. Each precursor bar has two sets of interdigitated electrodes, one that will serve as a signal electrode and the other, as a ground electrode.

Figure 5:
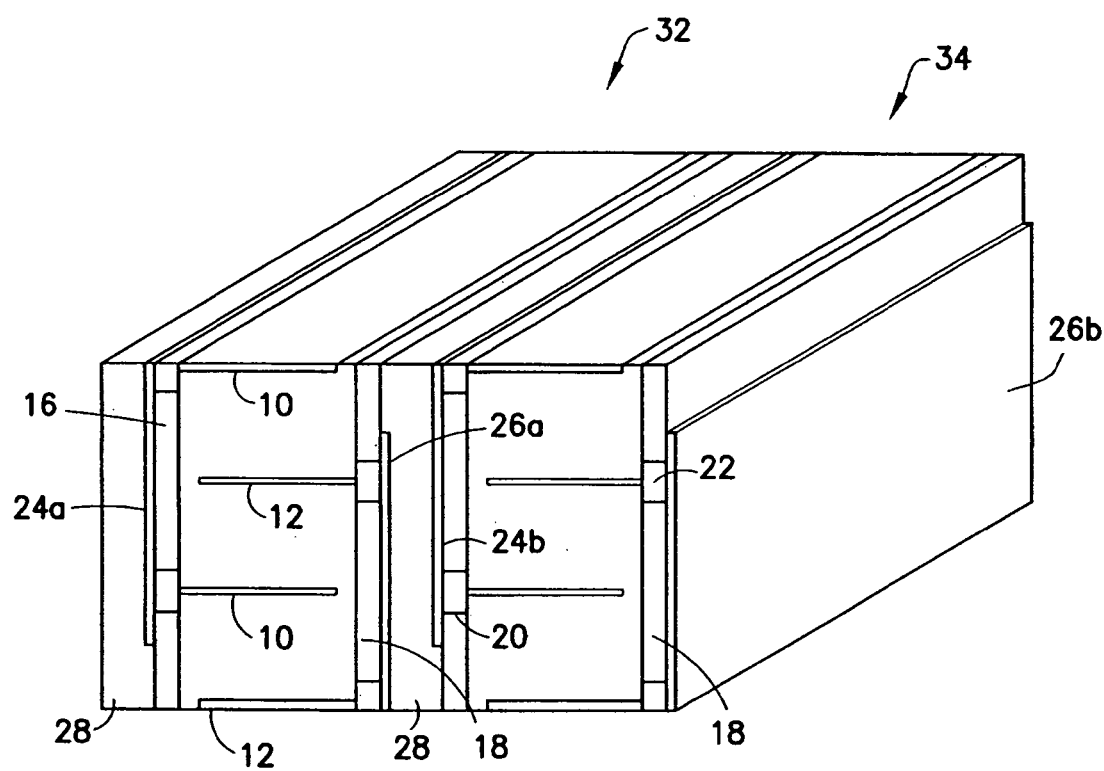

The precursor bars are then arranged in a side-by-side relationship, with the layer of spacer material 28 of each finished bar confronting and in contact with the metallized dielectric layer (without spacer material) of the adjacent finished bar, and with the respective electrodes in co-planar relationship. The arrayed and aligned bars are laminated together to form a plate of multi-layer ultrasound transducer elements, only two elements of such a row being depicted in FIG. 5. Following lamination, the ceramic faces of this newly formed plate (comprising a row of multi-layer stacks laminated together), are ground down until the metal of the first and fourth electrodes of each multi-layer stack is exposed, with the ground faces being parallel to the second and third (embedded) electrodes. Recalling that each electrode was formed by bonding two metal layers together, the goal of this grinding operation is to remove the first metal layer and the epoxy, leaving the second metal layer in place. Thereafter, metal can be re-deposited on the ground top and bottom faces of the plate to increase the thickness of the outer electrodes to equal the thickness of the embedded electrodes.

Alternatively, the grinding and re-metallization operations can be performed on each individual precursor bar, before the precursor bars are laminated together. The ceramic ends of each precursor bar can be ground down to expose the metal of the first and fourth electrodes and then metal is deposited on those ground faces until the thickness of the first and fourth electrodes equals the thickness of the second and third electrodes. The discrete multi-layer transducer elements are then arranged in a side-by-side relationship (with the respective electrodes in co-planar relationship) and laminated together to form a plate in the manner previously described.

Each discrete transducer element consists of a number of layers stacked one upon another, each of which possesses a metal layer on the surface. Also alternating metal layers are connected one to another along one side to yield an interdigitated electrode configuration. This multi-layer stack can be used to replace solid piezoelectric ceramic in either a linear acoustic array or a two-dimensional acoustic array.

Figure 6:
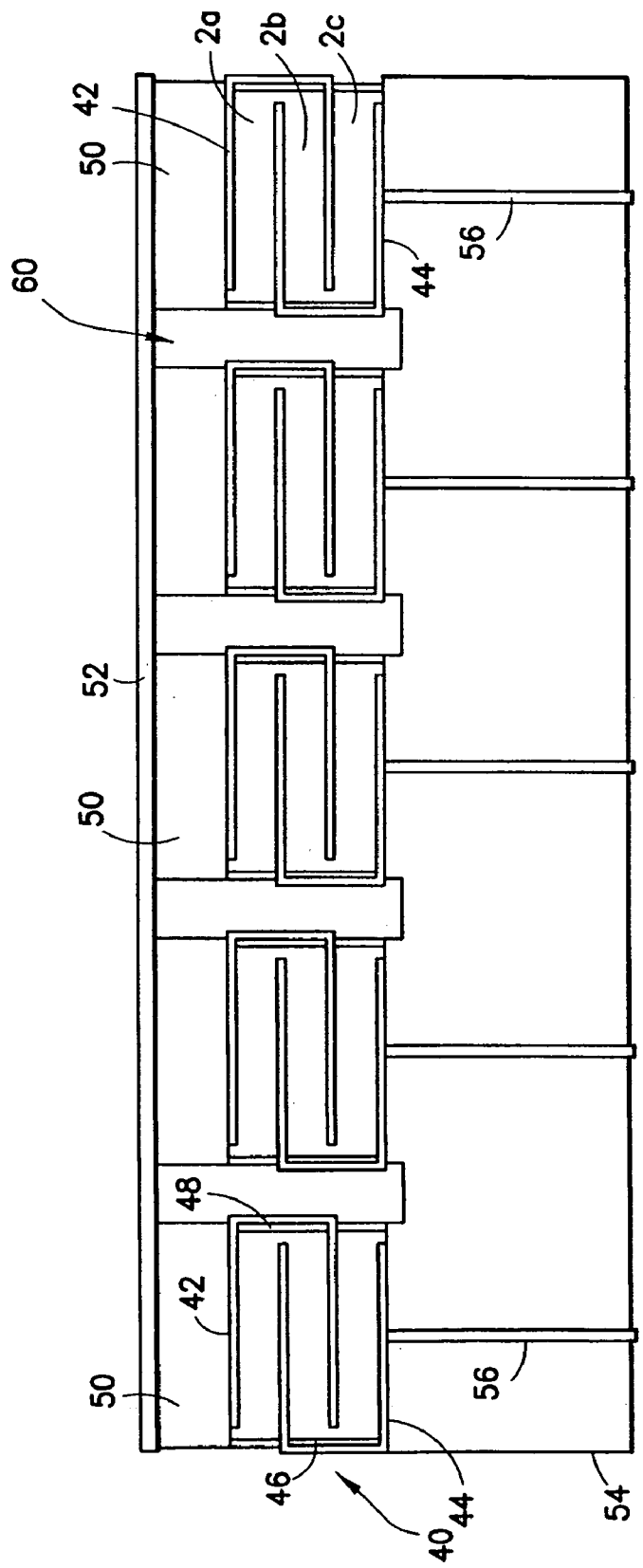

FIG. 6 shows a schematic of an acoustic transducer array in which the signal connections 56 (embedded in an acoustic backing layer 54) are made to the bottom electrode of each multi-layer stack 40 and the common ground connection 52 is made to the top electrode of each multi-layer stack (via an electrically conductive acoustic impedance matching layer 50). In addition the embedded electrodes of each multi-layer stack are electrically connected along the sides in an interdigitated fashion to yield a ground electrode 42 and a signal electrode 44. The layers 46 and 48 of low-dielectric-constant material confine the electric field to the high-dielectric-constant ceramic material, where it remains directed vertically. In this way, when a voltage is applied between the signal and ground electrodes, the piezoelectrically induced strains are almost entirely vertical near the edges of the embedded layers of the signal and ground electrodes. Spurious modes are therefore substantially reduced. In addition, the dielectric layer 46 electrically isolates the signal electrode 44 (i.e., the edge of the metal layer embedded between ceramic layers 2a and 2b) from the ground electrode 42, while the dielectric layer 48 electrically isolates the ground electrode 42 (i.e., the edge of the metal layer embedded between ceramic layers 2b and 2c) from the signal electrode 44.

A plate comprising a row of multi-layer stacks (similar in structure to that shown in FIG. 5, but having more stacks) is processed as follows to arrive at the ultrasound transducer device depicted in FIG. 6. First, the plate is set over a patterned array of electrical signal connectors. One example of such an array of electrical connectors is a series of spaced and mutually parallel flex circuits embedded within a body 54 of acoustically attenuative (i.e., scatterers and/or absorbers) material such that the ends of traces 56, imprinted on the dielectric substrates (not shown in FIG. 6) of the flex circuits, are exposed at the surface of the acoustically attenuative body (hereinafter "acoustic backing layer") that confronts the bottom face of the plate. The acoustic backing layer 54 can be bonded to the plate using a thin layer of epoxy that is substantially acoustically transparent and enables electrical contact between the traces 56 and the opposing metal layers of the signal electrodes 44.

In addition, an acoustic impedance matching layer 50 (shown diced in FIG. 6) made of electrically conductive material is joined to the metallized top surface of the ceramic by a thin (acoustically transparent) layer of epoxy (not shown) that allows ohmic contact between the matching layer and each ground electrode 42. Initially, the electrically conductive acoustic impedance matching layer is common to all transducer elements, meaning that it covers the entire array and is in electrical contact with the ground electrodes of all transducer elements in the array, only five transducer elements being shown in FIG. 6.

Next, the laminated structure is diced completely through the acoustic impedance matching layer and the ceramic layers in the orthogonal direction through each layer of spacer material, leaving a series of spaced kerfs 60. As seen in FIG. 6, the cuts may extend into the acoustic backing layer 54. [For the sake of illustration, the thickness of the metal layers has been exaggerated. In reality, the metal layers would not project into the gaps in the manner depicted.] This final dicing operation forms respective air gaps 60 between each multi-layer stack 40. In addition, the matching layer is cut to form an individual acoustic impedance matching layer 50 for each multi-layer stack 40.

A common ground electrode 52 is then placed across the front surfaces of the acoustic impedance matching layers 50, bridging the kerfs. Each ground electrode 42 of the individual stacks is electrically coupled to the common ground electrode 52 via the respective electrically conductive acoustic impedance matching layers 50. This may be accomplished by metallization printed on the bottom of a dielectric substrate, for example, a flex circuit. Alternatively, in the case where the spacer material is not removed (i.e., kerfs 60 are not formed), the common ground electrode may take the form of metallization applied on the front face of the laminated structure. Thereafter, additional acoustic matching layers (not electrically conductive) and a lens can be placed on the front surface of the transducer array in conventional manner.

In the resulting multi-layer ultrasonic transducer array seen in FIG. 6, the signals for driving the multi-layer ceramic elements pass through the acoustic backing layer 54 via traces 56 to the signal electrodes 44. The dielectric substrates of the flex circuits embedded in the acoustic backing layer 54 have been omitted from FIG. 6 for clarity in depicting the electrical connections. In addition, the portions of the flex circuits that connect traces 56 to the transducer cable have not been shown.

The above-described structure is much simpler to manufacture than previous methods for making a multi-layer ceramic structure. The resulting multi-layer ceramic is particularly useful in high-frequency acoustic transducers or multi-row acoustic transducers, including two-dimensional array transducers in which the small capacitance of the ceramic acoustic element is poorly matched in impedance to the rest of the ultrasound imaging system.

While the invention has been described with reference to preferred embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

As used in the claims, the word "stack" is not limited to elements stacked vertically, but rather a "stack" can be oriented at any angle, including horizontal or vertical. As used in the claims, the terms "odd-numbered electrodes" and "even-numbered electrodes" refer to the first, third, etc. and the second, fourth, etc. electrodes when counted in succession from one end of the stack.

The invention claimed is:

1. A method of manufacturing a workpiece, comprising the following steps:

placing respective layers of metal on the surfaces of both sides of a plate of ceramic material, the surfaces being generally mutually parallel;

cutting the metallized ceramic plate along parallel planes perpendicular to the metal layers to form a multiplicity of bars with respective sections of the cut metal layers disposed on opposite sides of each bar;

stacking the bars with metal layer facing metal layer, each pair of contacting metal layers forming a respective electrode;

bonding the stacked bars to form a stack with metal edges of the electrodes exposed on the periphery of the stack;

placing a first layer of dielectric material on a first face of the stack; and placing a second layer of dielectric material on a second face of the stack;

wherein each of the first and second dielectric layers comprises a respective substrate that supports a respective pattern of metal applied before placement of the dielectric layers on the respective faces of the stack, metal-filled or metalcoated vias being formed in the first dielectric layer for electrically connecting the metal patterns on the first dielectric layer to respective odd-numbered electrodes and in the second dielectric layer for electrically connecting the metal patterns on the second dielectric layer to respective even-numbered electrodes.

2. The method as recited in claim 1, further comprising the step of grinding the first and second faces of the bonded stack flat, leaving the metal edges of the electrodes exposed, before placing the layers of dielectric material.

3. The method as recited in claim 1, further comprising the following steps:

recessing the edges of at least some of the odd-numbered electrodes from the one face of the bonded stack and filling the recesses with electrically isolating material; and recessing the edges of at least some of the even-numbered electrodes from the other face of the bonded stack and filling the recesses with electrically isolating material, wherein said recessing steps are performed before placing the first and second dielectric layers.

4. The method as recited in claim 1, further comprising the step of placing a layer of electrically insulating spacer material on the first dielectric layer.

5. The method as recited in claim 4, further comprising the step of grinding the layer of spacer material to a desired thickness.

6. The method as recited in claim 4, further comprising the following steps:

cutting the bonded stack along parallel planes parallel to the electrodes to form a multiplicity of individual stacks, each stack comprising at least two odd-numbered electrodes and at least two even-numbered electrodes;

placing the individual stacks side by side with the respective electrodes being substantially co-planer and with the layers of spacer material being mutually parallel and disposed on the same side of each individual stack; and bonding the individual stacks to form a side-by-side array.

7. The method as recited in claim 6, further comprising the step of grinding the opposing faces of the array to expose metal of the odd-numbered electrodes closest to one face and the even-numbered electrodes closest to the other face.

8. The method as recited in claim 7, further comprising the step of bonding the side-by-side array to an acoustic backing layer comprising a body of acoustically attenuative material.

9. The method as recited in claim 8, further comprising the step of embedding a patterned array of electrical signal connectors in the body of acoustically attenuative material with respective ends of the electrical signal connectors exposed at a surface of the body.

10. The method as recited in claim 8, further comprising the step of cutting the side-by-side array along parallel planes perpendicular to a longitudinal axis of the individual stacks to a depth in the acoustic backing layer.

11. The method as recited in claim 8, further comprising the step of removing a substantial portion of the spacer material.

12. A method of manufacturing a workpiece, comprising the following steps:
   placing respective layers of metal on the surfaces of both sides of a plate of ceramic material, the surfaces being generally mutually parallel;
   cutting the metallized ceramic plate along parallel planes perpendicular to the metal layers to form a multiplicity of bars with respective sections of the cut metal layers disposed on opposite sides of each bar;
   stacking the bars with metal layer facing metal layer, each pair of contacting metal layers forming a respective electrode;
   bonding the stacked bars to form a bonded stack with metal edges of the electrodes exposed on the periphery of the bonded stack;
   placing a first layer of dielectric material on one face of the bonded stack;
   placing a second layer of dielectric material on another face of the bonded stack;
   forming openings in the first dielectric layer to expose portions of respective edges of the odd-numbered electrodes;
   forming openings in the second dielectric layer to expose portions of respective edges of the even-numbered electrodes;
   filling or coating the openings with metal; and
   placing respective layers of metal on the surfaces of the first and second dielectric layers in respective patterns, the respective patterned metal layers of the first and second dielectric layers being electrically connected to respective sets of odd-and even-numbered electrodes via the metal-filled or metal-coated openings.

13. The method as recited in claim 12, further comprising the step of grinding the first and second faces of the bonded stack flat, leaving the metal edges of the electrodes exposed, before placing the layers of dielectric material.

14. The method as recited in claim 12, further comprising the following steps:
   recessing the edges of at least some of the odd-numbered electrodes from the one face of the bonded stack and filling the recesses with electrically isolating material; and
   recessing the edges of at least some of the even-numbered electrodes from the other face of the bonded stack and filling the recesses with electrically isolating material,
   wherein said recessing steps are performed before placing the first and second dielectric layers.

15. The method as recited in claim 12, further comprising the step of placing a layer of electrically insulating spacer material on the first dielectric layer.

16. The method as recited in claim 15, further comprising the step of grinding the layer of spacer material to a desired thickness.

17. The method as recited in claim 12, further comprising the following steps:
   cutting the bonded stack along parallel planes parallel to the electrodes to form a multiplicity of individual stacks, each stack comprising at least two odd-numbered electrodes and at least two even-numbered electrodes;
   placing the individual stacks side by side with the respective electrodes being substantially co-planer and with the layers of spacer material being mutually parallel and disposed on the same side of each individual stack; and
   bonding the individual stacks to form a side-by-side array.

18. The method as recited in claim 17, further comprising the step of grinding the opposing faces of the array to expose metal of the odd-numbered electrodes closest to one face and the even-numbered electrodes closest to the other face.

19. A method of manufacturing a workpiece, the method comprising:
   placing layers of metal on both sides of a plate of ceramic material;
   cutting the metallized ceramic plate along parallel planes perpendicular to the metal layers to form a multiplicity of bars;
   stacking the bars with metal layer facing metal layer, each pair of contacting metal layers forming a respective electrode; and
   bonding the stacked bars to form a bonded stack.

20. A method of manufacturing, the method comprising:
   placing layers of metal on both sides of each of a plurality of plates of ceramic material;
   stacking the metallized plates with metal layer facing metal layer, each pair of contacting metal layers forming a respective electrode;
   bonding the stacked plates to form a bonded block; and
   cutting the bonded block along parallel planes perpendicular to the metal layers to form a plurality of stacks.

21. The method as recited in claim 20, further comprising the following steps performed for at least one of the stacks:
   placing a first layer of dielectric material on a first face of the stack; and
   placing a second layer of dielectric material on a second face of the stack;
   wherein each of the first and second dielectric layers comprises a respective substrate that supports a respective pattern of metal, vias being formed in the substrate of the first dielectric layer for electrically connecting the metal patterns on the first dielectric layer to respective odd-numbered electrodes and in the substrate of the second dielectric layer for electrically connecting the metal patterns on the second dielectric layer to respective even-numbered electrodes.

22. The method as recited in claim 21, further comprising the step, performed for at least one of the stacks, of grinding the first and the second faces of the stack flat, leaving the metal edges of the electrodes exposed, before placing the layers of dielectric material.

23. The method as recited in claim 21, further comprising the following steps performed for at least one of the stacks:
   recessing the edges of at least some of the odd-numbered electrodes from the one face of the stack and filling the recesses with electrically isolating material; and
   recessing the edges of at least some of the even-numbered electrodes from the other face of the stack and filling the recesses with electrically isolating material,
   wherein said recessing steps are performed before placing the first and the second dielectric layers.

* * * * *